United States Patent [19]

Fleischer et al.

[11] Patent Number: 4,755,783

[45] Date of Patent: Jul. 5, 1988

[54] INDUCTIVE DEVICES FOR PRINTED WIRING BOARDS

[75] Inventors: Cathy Fleischer, Thompson, Conn.; William Harper, Tempe; Joseph E. Johnston, Chandler, both of Ariz.; Scott Simpson, Woodstock; Richard T. Traskos, Brooklyn, both of Conn.

[73] Assignee: Rogers Corporation, Rogers, Conn.

[21] Appl. No.: 932,586

[22] Filed: Nov. 18, 1986

[51] Int. Cl.⁴ .................... H01F 15/04; H01F 27/28
[52] U.S. Cl. ................... 336/84 C; 336/180; 336/182; 336/200; 336/223
[58] Field of Search ............ 336/200, 205, 206, 223, 336/180, 232, 192, 84 R, 84 C, 182, 183

[56] References Cited

U.S. PATENT DOCUMENTS

| | | | |
|---|---|---|---|
| 2,440,652 | 4/1948 | Beverly | 336/206 X |
| 3,102,245 | 8/1963 | Lawson, Jr. | 336/205 X |
| 3,267,402 | 8/1966 | Reimer | 336/200 |
| 3,886,510 | 5/1975 | Canup et al. | 336/84 C X |
| 4,268,810 | 5/1981 | Iwasa et al. | 336/206 X |
| 4,308,513 | 12/1981 | Layton et al. | 336/223 X |

FOREIGN PATENT DOCUMENTS

| | | | |
|---|---|---|---|
| 214512 | 4/1961 | Austria | 336/206 |
| 1044342 | 12/1978 | Canada | 336/205 |
| 2401492 | 7/1974 | Fed. Rep. of Germany | 336/223 |
| 2445143 | 4/1976 | Fed. Rep. of Germany | 336/180 |
| 2543762 | 4/1976 | Fed. Rep. of Germany | 336/223 |
| 77117 | 6/1980 | Japan | 336/205 |
| 221594 | 9/1924 | United Kingdom | 336/205 |
| 743717 | 1/1956 | United Kingdom | |
| 1021344 | 3/1966 | United Kingdom | 336/206 |
| 694902 | 10/1979 | U.S.S.R. | 336/223 |
| 1198576 | 12/1985 | U.S.S.R. | 336/192 |

OTHER PUBLICATIONS

"High Power, High Voltage, Audio Frequency Transformer Design Manual", J. G. Howe et al, Aug. 31, 1964, pp. 185, 188, 189.

IBM Technical Disclosure Bulletin, "Flexible Circuit Solenoid," Gonnella et al, vol. 16, No. 9, Feb. 1974, p. 3008.

Primary Examiner—Thomas J. Kozma
Attorney, Agent, or Firm—Fishman, Dionne & Cantor

[57] ABSTRACT

Inductive devices, i.e., transformers, coils, inductors, etc. are produced from a rolled flexible circuit. The flexible circuit is comprised of a dielectric substrate having a circuit pattern thereon. The circuit pattern is configured such that, upon rolling, one or more coils is formed thereby defining an inductor, transformer, etc. Additionally, these inductive devices may be easily shielded using a ground plane in the flexible circuit. The rolled flexible circuit may be secured in several ways including an adhesive or by using a thermoplastic bonding layer which acts to heat seal the circuit together. The inductive devices of the present invention may be wrapped or rolled about a permeable core which improves inductance. Inductor devices manufactured in accordance with the present invention have the advantages of being small, surface mountable, inexpensive to manufacture and being capable of insertion onto printed wiring boards using automated insertion equipment. The small size of the inductor devices permit the present invention to take up only small areas on the circuit board thereby conserving valuable "real estate" on the printed wiring board.

40 Claims, 10 Drawing Sheets

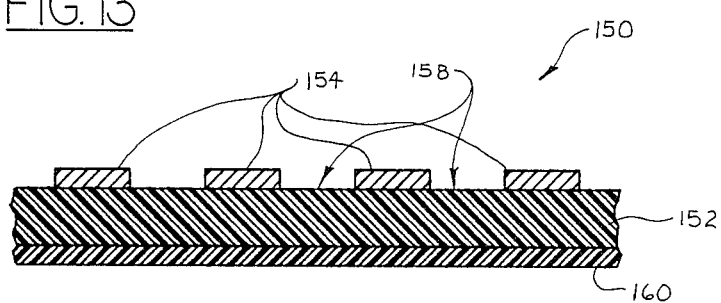

INDUCTIVE DEVICES FOR PRINTED WIRING BOARDS

BACKGROUND OF THE INVENTION

This invention relates to inductive devices for use on printed wiring boards. More particularly, this invention relates to new and improved inductors, couplers, transformers and the like formed from rolled flexible circuits for use as electronic components in printed wiring board applications.

Every conductor carrying current generates a magnetic field which surrounds the conductor. This field is proportional to the current and is strongest near the conductor. An inductor is a conductor formed in such a way as to miximize the strength of the magnetic field for a given volume. The most compact form is a coil. The coil must be wound in one direction only or the magnetic field created by current flowing clockwise will tend to cancel the field generated by the current flowing in the counter-clockwise turns of the coil. The inductance of the coil is proportional to the square of the number of turns and the square of the internal radius of the coil. The inductance of a coil can be greatly increased by winding it on a magnetically permeable (ferromagnetic) core such as iron or ferrite. Additionally, a permeable "U" connecting the two ends of the core can be used to form a complete magnetic circuit. The permeable material magnifies the magnetic field just as a material having a high dielectric constant magnifies the electric field in a capacitor.

Inductors are used in a number of applications. Generally they are used in electronic filters. This is due to the fact that inductors tend to block the passage of high frequency signals while allowing low frequency signals to pass freely. The higher the inductance, the lower the frequency at which this blocking action begins to occur (this is called the cutoff frequency).

Transformers are two or more inductors in the same magnetic circuit. In the simplest case, transformers take the form of two insulated coils each wound around a common core. The two coils are thus linked via the magnetic circuit even though there is no direct electrical connection. One of the coils is called the primary coil and the other is the secondary coil. A sinusoidal signal is applied to the primary coil, generating a time varying magnetic field in the permeable core. The magnetic field induces a sinusoidal signal of the same frequency in the secondary coil. If both coils had the same number of turns and the circuit were completely efficient, the signal out of the secondary coil would match the signal applied to the primary coil. However, a different phenomenon occurs when the number of turns in the primary and secondary coils differ. For example, if the secondary coils has twice as many turns as the primary coil, the voltage induced in the secondary coil will be twice that of the voltage inputted to the primary coil. Thus, the voltage has been stepped up by the transformer in a manner proportional to the ratio of the number of secondary turns divided by the number of primary turns. This is a major use of transformers, that is to step voltages up and down. The secondary coil can be tapped at various locations to pull off fractions of the total secondary voltage. Another use of transformers is isolation. The primary and secondary coils are electrically isolated yet signal transfer occurs. DC signals are blocked, only time varying signals are transferred.

Presently, in the field of printed wiring board circuitry design, coils, transformers and other inductive elements are not easily utilized and include many problems and deficiencies. A significant difficulty with currently available inductive devices is their typically large size, difficulty and high expense in manufacturing and the fact that they are not easily fabricated as low-profile, flat components. Also, prior art inductive devices are heavy and bulky due to the large amounts of wires used in the fabrication thereof.

As a consequence of these problems, inductors are generally not surface mountable on a printed wiring board. In some cases, inductors are produced as part of the printed wiring board's original circuitry, whether plated, thin-film or thick-film. Inductors produced in this way have the disadvantage of using large amounts of valuable board space (real estate).

SUMMARY OF THE INVENTION

The above discussed and other problems and deficiencies of the prior art are overcome or alleviated by the inductive devices of the present invention. In accordance with the present invention, inductive devices, i.e., transformers, coils, inductors, etc. are produced from a rolled flexible circuit. The flexible circuit is comprised of a dielectric substrate having a circuit pattern thereon. The circuit pattern is configured such that, upon rolling, one or more coils is formed thereby defining an inductor, transformer, etc. Additionally, these inductive devices may be easily shielded using a ground plane in the flexible circuit.

The rolled circuit may be secured in several ways including an adhesive or by using a thermoplastic bonding layer which acts to heat seal the circuit together.

The inductive devices of the present invention may be wrapped or rolled about a permeable core (ferromagnetic) which improve (increase) inductance. Inductor devices manufactured in accordance with the present invention have the advantages of being small, surface mountable, inexpensive to manufacture and being capable of insertion onto printed wiring boards using automated insertion equipment. The small size of the inductor devices permit the present invention to take up only small areas on the circuit board thereby conserving valuable "real estate" on the printed wiring board.

The above-discussed and other features and advantages of the present invention will be appreciated and understood by those skilled in the art from the following detailed description and drawings.

BRIEF DESCRIPTION OF THE DRAWINGS

Referring now to the drawings, wherein like elements are numbered alike in the several FIGURES:

FIG. 8A is a schematic diagram of the transformer of FIG. 8;

FIG. 13 is a cross-sectional elevation view of a flexible circuit for forming an inductive device in accordance with the present invention.

DESCRIPTION OF THE PREFERRED EMBODIMENT

This invention relates to inductive devices for use as discreet components on a printed wiring board (pwb). In its simplest form, the present invention comprises a substrate or base layer of flexible dielectric material, i.e., polyimide (Kapton) film, fluoropolymeric film, polyester film, etc., having a circuit pattern thereon. The circuit pattern is formed such that, upon rolling, one or more coils will be produced. Significantly, all the current flowing through the coil or coils should travel in the same direction. It will be appreciated that if an inductive coil were made by etching a conductive trace that traveled back and forth on a flexible circuit and that flexible circuit was then rolled up on a magnetic core, a poor inductive device would result. This is because the oppositely traveling currents cancel each other so that the resultant magnetic field will be very weak leading to low inductance. The flexible circuit must be configured to eliminate this cancellation and therefore the current must travel in the same direction.

Figure 1:
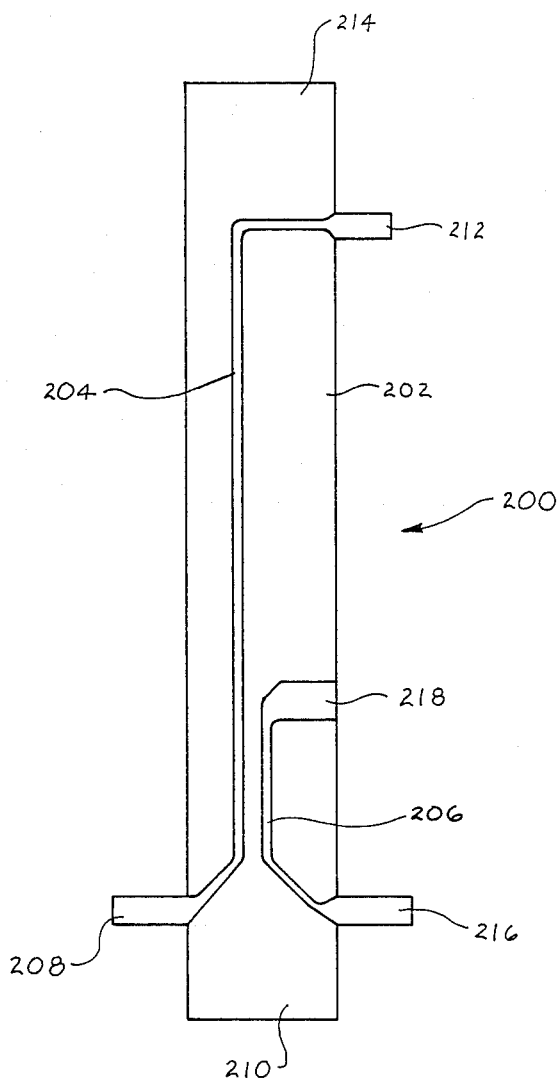
FIG. 1 is a plan view of a single pass inductor device prior to being in accordance with the present invention.
Figure 1A:
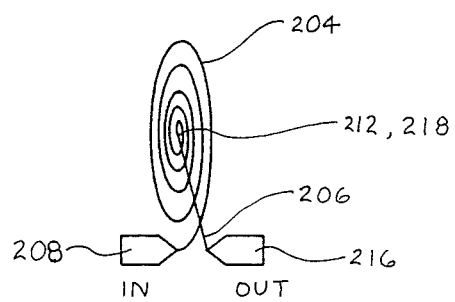
FIG. 1A is a schematic diagram of the single pass inductor device of FIG. 1.

Referring first to FIGS. 1 and 1A, a first embodiment of an inductive device in accordance with the present invention is shown generally at 200. Inductive device 200 is a single pass inductor and represents the present invention in its most basic form. Inductor 200 includes a flexible dielectric substrate 202 having a pair of circuit traces 204 and 206 formed thereon by any known circuit forming methods. Circuit trace 204 includes an input pad 208 positioned in a first end or portion 210 of substrate 202 and terminates at a first connector pad or site 212 at a second end or portion 214 of susbstrate 202. It will be appreciated that circuit trace 204 travels substantially the entire length of substrate 202. Circuit trace 206 includes an output pad 216 positioned on substrate portion 210 and terminates at a second connector pad or site 218.

The flexible circuit shown in FIG. 1 is then rolled, starting with substrate portion 214. During rolling, connector site 212 is electrically connected or mated to connector site 218 so that traces 204 and 206 will be interconnected to form a single, continuous rolled circuit trace. This mating between pads 212 and 218 is effected by folding the flexible pad 212 onto connector site 218 at the appropriate point during rolling. Significantly, the single rolled circuit trace will result in a signal being inputted to input pad 208 and traveling in the same direction until the signal reaches output pad 216. Thus, no deleterious cancellation of current will result. This important feature of the present invention is shown schematically in FIG. 1A wherein the flexible circuit 200 of FIG. 1 is shown subsequent to rolling and interconnection of pads 212 and 218.

While input pads 208 and 216 may or may not extend outwardly from substrate 202, it is an important feature of the present invention that connecting site 212 extend laterally from the main portion of substrate 202 so that connection can be effected between the two traces 204 and 206 during rolling. It is also important that each "pass" formed subsequent to rolling be comprised of a pair of circuit traces interconnected in a manner similar to that shown in FIG. 1. Typically, one trace will extend substantially the length of the substrate while the other trace will be relatively shorter. The following discussion of FIGS. 2-13 relate to additional embodiments of conductive devices of the present invention, all of which include the basic structure outlined in FIGS. 1 and 1A.

Figure 2A:
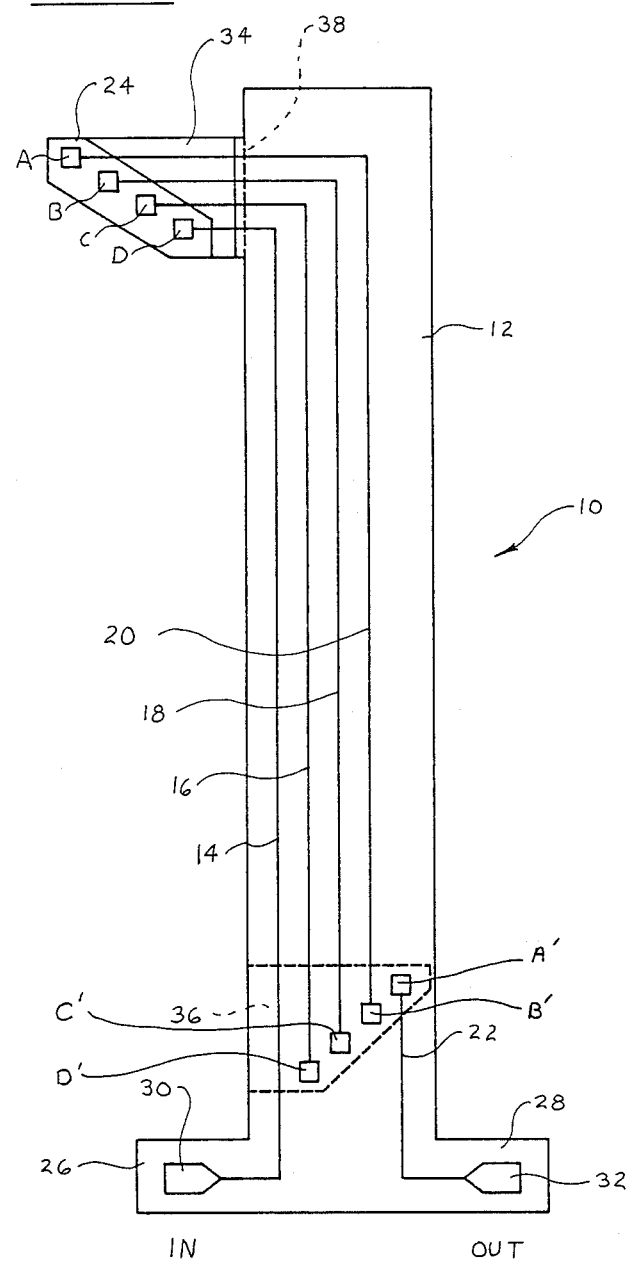
FIG. 2A is a schematic diagram of the multipass inductor of FIG. 2.
Figure 2B:
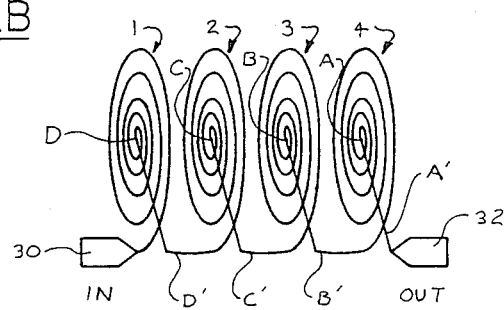
FIG. 2 is a plan view of a multipass inductor device prior to being rolled in accordance with the present invention.

Referrring now to FIGS. 2 and 2A, a second embodiment of an inductive device in accordance with the present invention is shown generally at 10. Inductive device 10 is a multi-pass inductor and comprises a substrate 12 comprised of a flexible dielectric material and a series of five (5) conductive traces 14, 16, 18, 20 and 22 thereon. Substrate 12 is substantially rectangular and includes a connector flap 24 at one end thereof and a pair of oppositely disposed end flaps 26 and 28 at the other end. Circuit trace 14 includes an input pad 30 on end flap 26 and runs the length of substrate 12 terminating at end pad D on connector flap 24. Trace 16 begins at start pad D' and terminates at end pad C on connector flap 24. Similarly, traces 18 and 20 begin at start pads C' and B', respectively, and terminate at end pads B and A, respectively on connector flap 24. Finally, trace 22 begins at start pad A' and terminates at output pad 32. A cover film identified at 34 is provided over a portion of circuit traces 14, 16, 18, and 20 on connector flap 24.

The multi-pass inductor 10 on flexible substrate 12 is designed to increase the number of turns in the coil and therefore the inductance of the device. Each coil is formed from a single trace 14–22 (or pass) and is connected from the innermost layer to the outermost layer. This results in proper current flow (same direction) and, therefore maximum inductance. Flexible circuit 10 is rolled on a core beginning at the end incorporating connector flap 24 with the back of the circuit (circuit side up) contacting the core. The circuit is rolled until flap 24 is aligned with the area 36 over which the flap is to be folded. The flap is folded over at fold line 38 and pad connections made via solder or other type of bonding. Rolling continues until the device is completely rolled up.

In operation, a signal is introduced to the input pad 30 and travels down the first pass 14 to end pad D. This pass 14 is in the form of a coil since the circuit has been tightly wound on a core. End pad "D" is connected to start pad "D'" so the signal continues from start pad "D'" to end pad "C", the second pass. The signal passes in a similar fashion through passes three and four. After the fourth pass, the signal passes from end pad "A" to start pad "A'" and out through output pad 32. Similar circuits could be made having any number of passes desired and the passes could be of any practical length necessary to achieve a particular inductance level.

FIG. 2A is a schematic representation of the multi-pass inductor of FIG. 2 with the four (4) coils or passes being so indicated.

Turning now to FIGS. 3 through 5B, a third embodiment of an inductive device in accordance with the present invention is shown generally at 40. Inductive device 40 is a transformer and like inductive device 10, transformer 40 is comprised of a flexible dielectric substrate 42 having a predetermined pattern of circuit traces thereon. In this case, the circuit traces are comprised of two parallel traces 44 and 46 and a second pair of parallel traces 48 and 50. Flexible substrate 42 is essentially rectangular and includes a fold tab 52 at one end thereof and a pair of oppositely disposed input/output tabs 54 and 56 for the primary and secondary coils. It will be appreciated that traces 44 and 50 will interconnect to form the primary coil, while traces 46 and 48 will interconnect to form the secondary coil. Trace 44 begins at an input/output pad 58 and terminates at a connector pad 60. Similarly, trace 46 begins at an input/output pad 62 and terminates at a connector pad 64. Trace 48 begins at an input/output tab 66 and terminates at a connector tab 68 while circuit trace 50 begins at an input/output tab 70 and terminates at a connector pad 72.

Figure 3A:
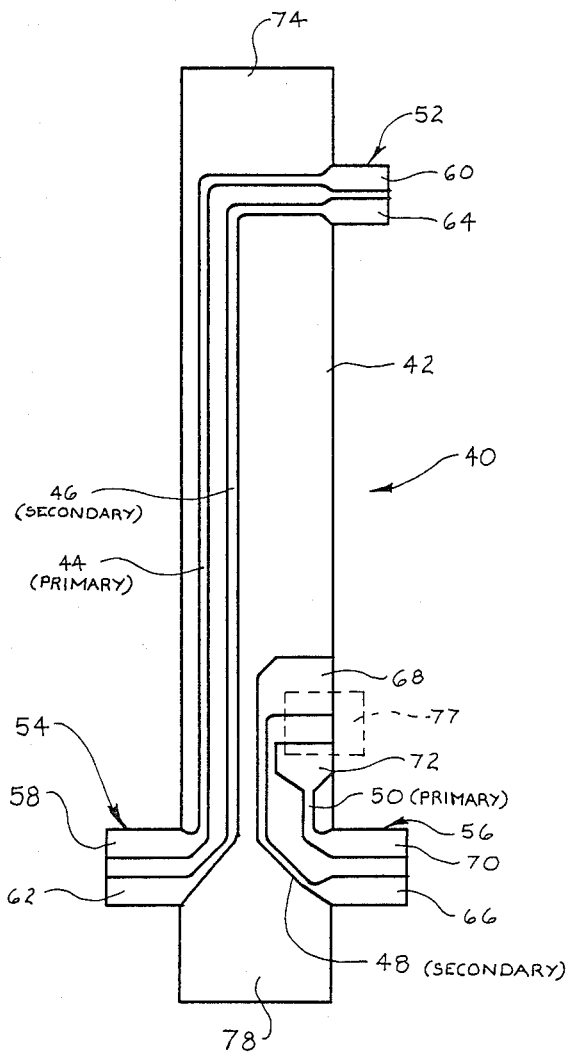
FIG. 3A is a schematic diagram of the transformer of FIG. 3.
Figure 4:
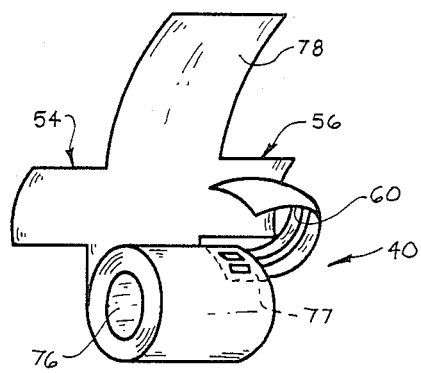
FIG. 4 is a perspective view of the transformer of FIG. 3 during rolling.
Figure 5A:
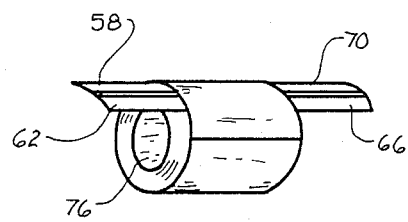
FIG. 5A is a bottom perspective view of the transformer of FIG. 3 subsequent to rolling.
Figure 5B:
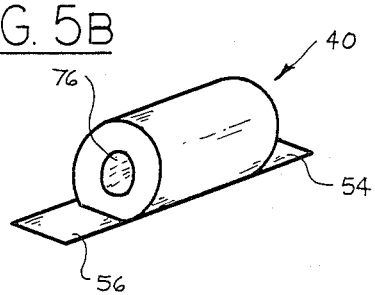
FIG. 5B is a top perspective view of the transformer of FIG. 3 subsequent to rolling.
Figure 6A:
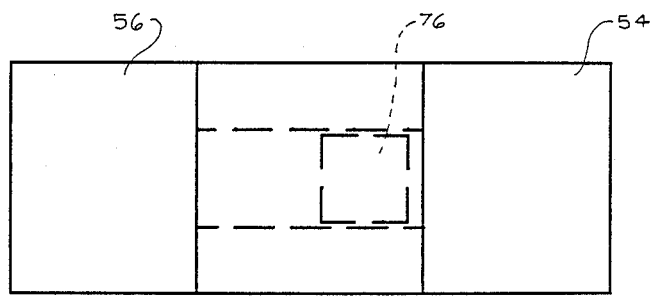
FIGS. 6A and 6B are top plan views of the transformer of FIG. 5B having a permeable core therein.
Figure 6B:
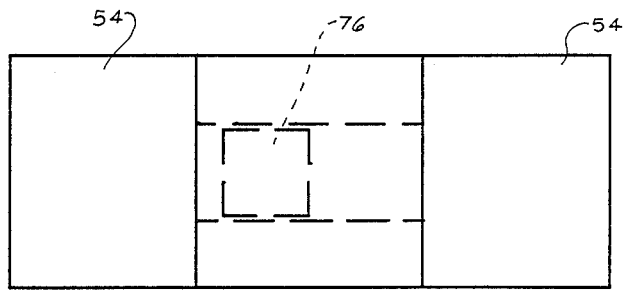
Figure 7:
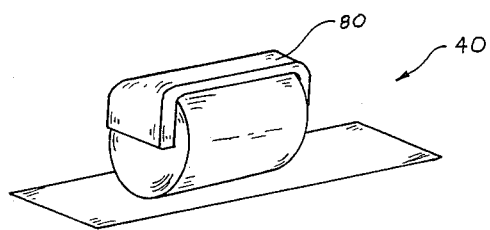
FIG. 7 is a perspective view of the transformer of FIG. 5B with a bridge thereon.

During assembly, and as shown in FIGS. 4, 5A and 5B, the flexible circuit 40 is rolled, conductive trace side up starting at the rolling tab identified at 74 onto a permeable core 76. At the appropriate stage, fold tab 52 is folded onto the fold tab target area identified by the dotted lines 76 thereby making a complete circuit for the primary coil and secondary coil from the left input-/output tab to the right input/output tab. Thus, circuit trace 44 (primary coil) will be interconnected to circuit trace 50 at the junction of pads 60 and 72; and circuit trace 46 (secondary coil) will be interconnected to circuit trace 48 at the juncture of pads 64 and 68. Rolling continues with the outer layers securring the fold tab 52 and forming an outer sheath with the portion of the flexible circuit identified at 78. As with inductive device 10, transformer 40 will have current flowing in only one direction. Subsequent to rolling, transformer 40 will appear as shown in FIG. 5B. Transformer 40 is now well suited for use in conjunction with surface mounting on a printed wiring board. A schematic diagram of transformer 40 is shown in FIG. 3A. Turning now to FIGS. 6A, 6B, and 7, it will be appreciated that the core 76 may be comprised of a plastic or a ferromagnetic material depending upon the desired value of inductance in the operating frequency range. The core, if permeable, may also be moved in or out of the rolled flexible circuit so as to adjust the degree or amount of coupling. Thus for example, in FIG. 6A, the core has been moved towards the right which will result in relatively less coupling than in FIG. 6B wherein the core is less than the full width of the flexible substrate for variable coupling; and has been moved toward the left. This variable degree of coupling results from the interaction of the core with the primary and secondary coils. For maximum coupling efficiency, a complete magnetic circuit may be required. Such a complete magnetic circuit is shown in FIG. 6 wherein a small permeable bridge 80 is attached to transformer 40 with a full width magnetic core being provided within the rolled flexible circuit.

Figure 3B:
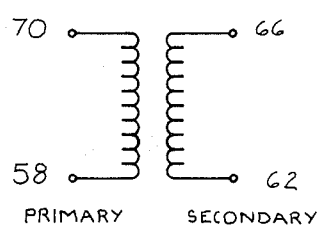
FIG. 3 is a plan view of a transformer prior to rolling in accordance with the present invention.
Figure 9:
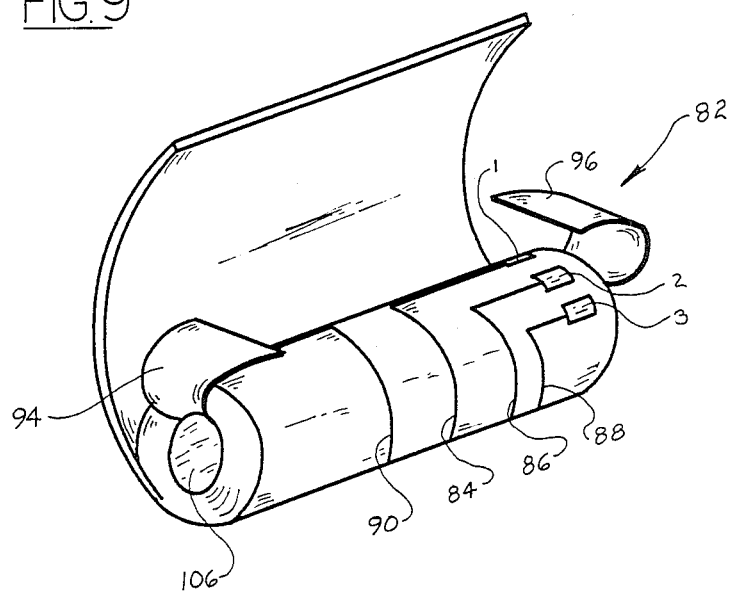
FIG. 9 is a perspective view of the transformer of FIG. 8 during rolling.
Figure 10:
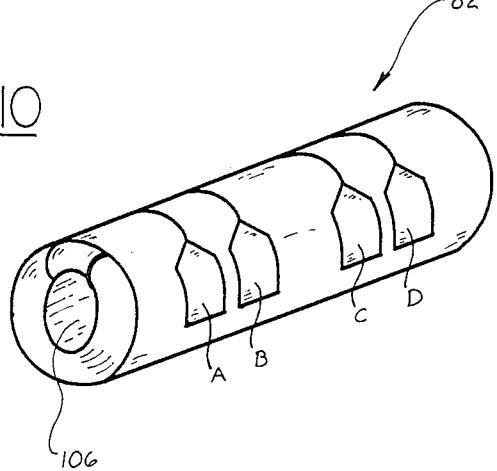
FIG. 10 is a perspective view of the transformer of FIG. 8 subsequent to rolling.

Transformer 40 of FIG. 3 utilizes a flexible circuit which includes an equal number of turns in the primary and secondary coils (one each). It will be appreciated however, that the present invention may be expanded to transformers with more turns in one coil than in the other such as the transformer 82 shown in FIGS. 8-10. In this case, the secondary coil is comprised of three full length traces 84, 86, and 88 which are connected using the folding tab techniques described hereinabove to produce a coil three times as long as the primary coil comprised of a single full length trace 90. The remaining structure of transformer 82 is similar to the previously described inductive devices. Thus, the primary coil includes a pair of input/output tabs A and B with input tab A connected by trace 92 to start pad 4 and input/output pad B connected via trace 90 to end pad 4 on connector flap 94. Similarly, input/output pad C is connected to end pad 1 via trace 84. Trace 86 terminates at either end between end pad 2 on connector flap 96 and start pad 2. Trace 88 terminates between end pad 3 on connector flap 96 and start pad 1. Finally, input/output pad D terminates at start pad 3. Transformer 82 is rolled in a manner similar to transformer 40 as shown in FIGS. 9 and 10 with connector flap 96 being folded at fold line 98 over the area identified at 100 and connector flap 94 being folded at fold line 102 over the area identified at 104. Thus, the respective start and end pads bearing the same number (i.e., startpad 1 and end pad 1) will contact each other thereby completing an electrical circuit. Transformer 82 will thus have one (1) turn in its primary coils and three (3) in its secondary coil. The flexible transformer circuit 82 is rolled about a core 106. Transformer 82 is shown subsequent to rolling in FIG. 10 with input/output pads A through D shown as part of the original cylinder rather than as attached to the extended input/output tabs as in the FIG. 3 transformer and FIGS. 1 and 2 inductors. However, it will be appreciated that input/output tabs as in FIGS. 1-3 may also be used in conjunction with the embodiment of the present invention shown in FIGS. 8-10. Conversely, the input/output pads provided directly on the rolled cylinder as shown in FIG. 10 may similarly be used with the embodiments of the present invention shown in FIGS. 2 and 3.

Figure 8:
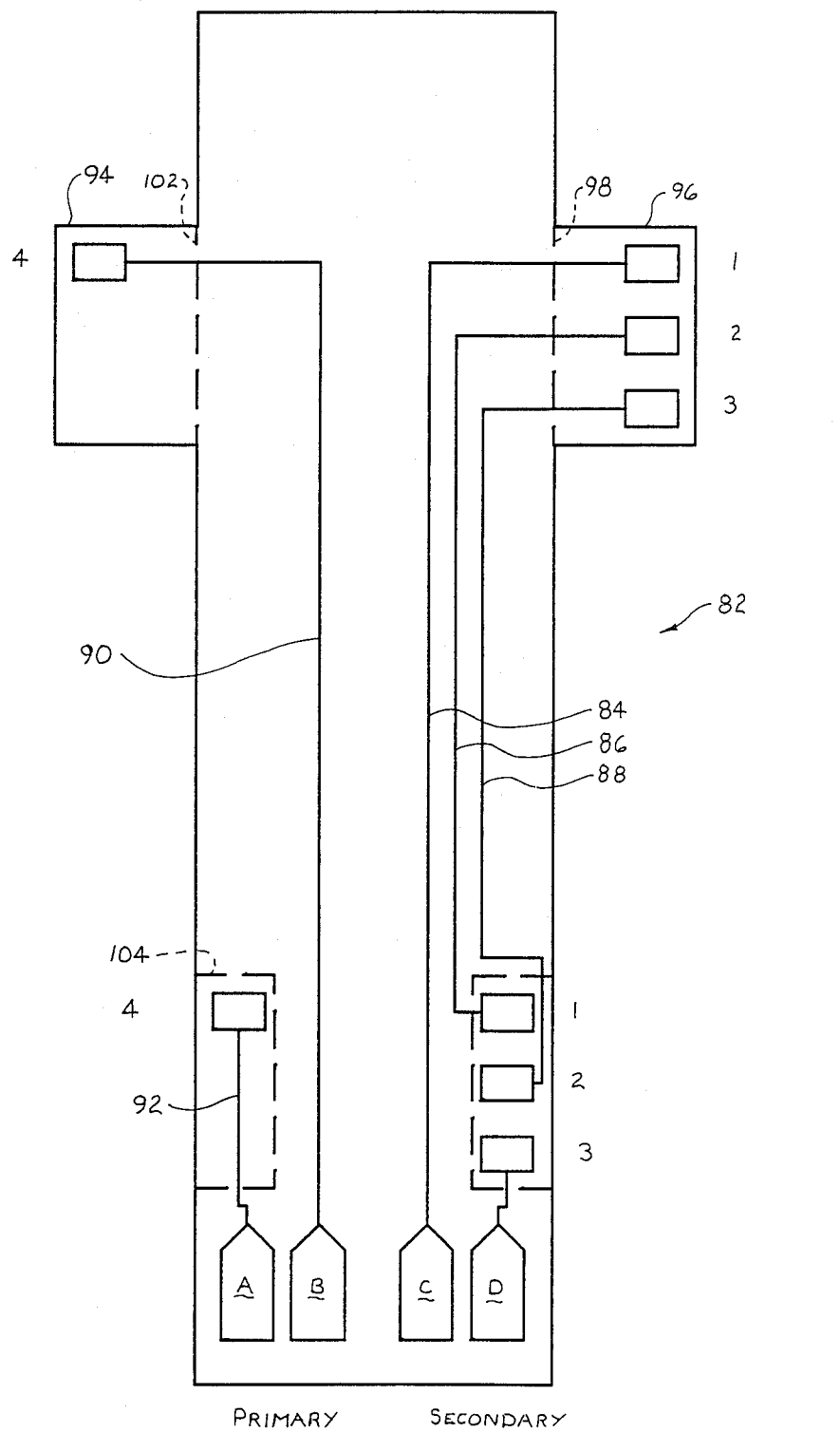
FIG. 8 is a plan view of another embodiment of a transformer prior to being rolled in accordance with the present invention.

As schematically shown in FIG. 8A, a transformer device as shown at 82 in FIG. 8 permits voltage multiplication. Of course, the number of turns in the primary and secondary coils may be varied in any manner desired to achieve a preselected voltage multiplication upwardly or downwardly.

Figure 11A:
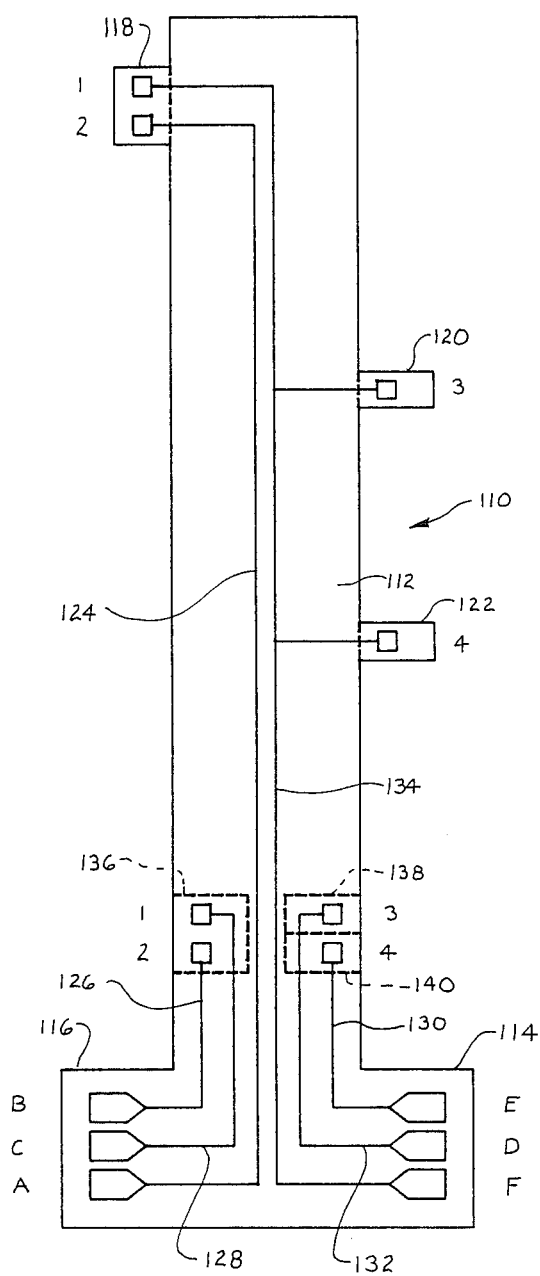
FIG. 11A is a schematic view of the multi-tap transformer of FIG. 11.
Figure 11B:
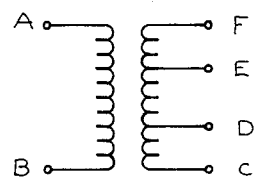
FIG. 11 is a plan view of a multi-tap transformer in accordance with the present invention.

Yet another embodiment of an inductive device in accordance with the present invention is shown in FIG. 11. The inductive device of FIG. 11 is another variation of a transformer and is termed a multi-tap transformer. The multi-tap transformer is shown generally at 110 and comprises a substantially rectangular dielectric substrate material 112 having a plurality of conductive traces thereon. Substrate 12 further includes a pair of oppositely disposed input/output tabs 114 and 116, a connector tab 118 and a pair of tap tabs 120 and 122. Input/output tab 116 includes three input/output pads A, B, and C. Input/output pad A is connected by trace 124 to end pad 2 on connector tab 118. Input/output pad B is connected by trace 126 to connector pad 2 while input/output pad C is connected by trace 128 to connector pad 1. Similarly, input/output pad E is connected by trace 130 to connector pad 4 while input/output pad D is connected by trace 132 to connector pad 3. Finally, input/output pad 4 is connected by trace 134 to both tap pads 3 and 4 on tap tabs 120 and 122 and to end pad 1 on connector tab 118.

Flexible circuit 110 is rolled in a manner similar to the previously discussed inductive devices with the various tabs and flaps folding over certain target areas. Thus, connector tab 118 will fold over the target area identified at 136 (connector pads 1 and 2). Tap tab 120 will be aligned with and folded over the target area identified at 138 (connector pad 3) while tap tab 122 will fold over the target area identified at 140 (connector pad 4). It will be appreciated that this particular version of a multi-tap transformer is single pass for both primary and secondary windings. In operation, the primary signal enters via input pad A and travels down trace 124 to end pad 2. Thereafter, the signal proceeds from end pad 2 to connector pad 2 and to output pad B via trace 126. This circuit trace forms the primary coil. The secondary coil operates as follows. The output signal appears between pads F and C which are the end points of a single pass completed by the mating of end pad 1 with connector pad 1. Taps are also pulled off via tap pads 3 and 4 through mating connector pads 3 and 4 to output pads D and E respectively. Such a transformer can also be made multi pass to allow the transformer to step up voltages by using the techniques outlined in accordance with the embodiment of the present invention shown in FIGS. 8–10. A permeable core as described in conjunction with the several embodiments may also be used in accordance with transformer 110 of FIG. 11. FIG. 11A is a schematic of multi-tap transformer 10.

Figure 12B:
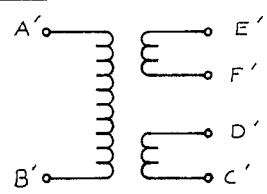
FIG. 12 is a plan view of a multi-coil transformer in accordance with the present invention.
FIG. 12A is a schematic view of the multi-coil transformer of FIG. 12.
Figure 12A:
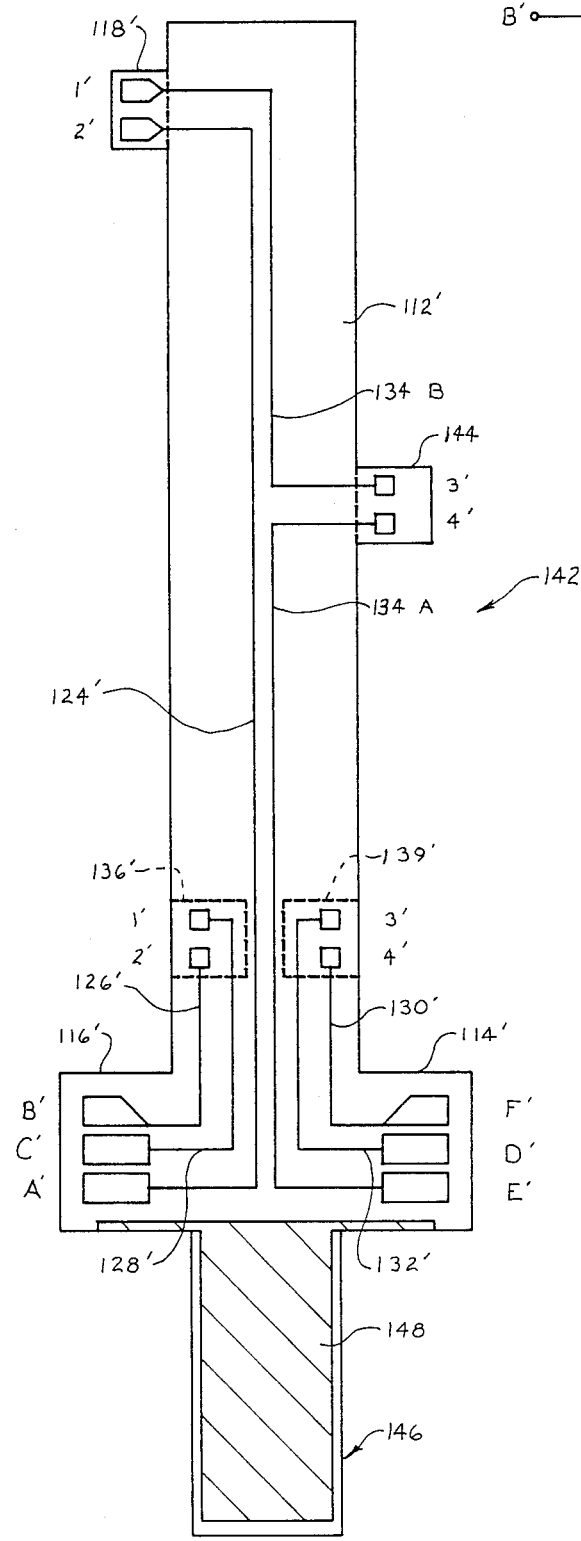

Turning now to a discussion of FIGS. 12 and 12A, still another embodiment of an inductive device in accordance with the present invention is shown generally at 142. Inductive device 142 is a multi coil transformer. Multi-coil transformer 142 is a transformer in which there is more than one secondary coil. Such a transformer is similar to the multi-tap transformer identified at 110 in FIG. 11 except that the individual secondary coils are electrically isolated while in a multi tap transformer (FIG. 11) the taps are on the same secondary coil and, therefore, are not isolated. Accordingly, the flexible circuit of FIG. 12 is substantially identical to the flexible circuit of FIG. 11 with the same structure being identified with a prime in FIG. 12. The main differences between the embodiments of FIGS. 12 and 11 is that trace 134 of FIG. 11 (which leads to end pads 3 and 4) is broken up into separate traces 134A and 134B in FIG. 12; with trace 134A terminating at end pad 4 and trace 134B terminating at end pad 3'. Also, unlike the two separate tap tabs 120 and 122 of FIG. 11, the embodiment of FIG. 12 includes end pads 3 and 4 on a single connector tab 144.

Flexible circuit 142 is rolled in a manner similar to the previously discussed inductive devices with the various tabs and flaps folding over certain target areas. Thus, connector tab 118' will fold over the target area identified at 136' (connector pads 1' and 2'). Tap tab 144' will be aligned with and folded over the target area identified at 138' (connector pads 3' and 4'). In operation, the primary signal enters via input pad A' and travels down trace 124' to end pad 2'. Thereafter, the signal proceeds from end pad 2' to connector pad 2' and to output pad B' via trace 126'. This circuit trace forms the primary coil. In the first secondary coil, the output signal appears between pads E' and F' which are the end points of a single pass completed by mating of end pad 4' with connector pad 4'. The second secondary coil operates as follows. The output signal appears between pads C' and D' which are the end points of a single pass completed by the mating of end pad 1' with connector pad 1' and end pad 3' with connector pad 3'. A permeable core as described in conjunction with the several embodiments may also be used in accordance with transformer 142 of FIG. 12. FIG. 12A is a schematic of multi-coil transformer 142.

All of the various embodiments of the present invention described above may be easily shielded using a ground plane in the flexible circuit. An example of such a ground plane is shown in FIG. 12 wherein substrate 112' includes an extension 146. A portion of extension 146 includes conductive material (i.e., copper) 148 thereon. Preferably, enough conductive material should be provided so that, upon rolling, at least the final roll or rolls will consist of conductive coated substrate. These final rolls of conductive coated substrate will thus act as a ground plane and shield the internal circuitry. It will be appreciated that conductive coating 148 broadens substantially at its base to shield input and output pads A'–F'.

The inductive devices of the present invention comprised of a rolled flexible circuit may be held together using an appropriate adhesive system such as acrylic, epoxy or phenolic-butyral. However, while well suited for its intended purposes, there is a perceived problem with respect to several mechanical characterisitcs of an inductive device which has been rolled using an adhesive system such as those used conventionally in flexible circuit constructions. Such conventional adhesives are relatively low softening temperature materials which can lead to delamination and unrolling of inductor device at solder temperature. The conventional adhesives also would degrade at significant rates with time at temperatures below the solder temperatures (e.g., 150°–260° C.) which could also lead to delamination and changed electrical performance and can also permit solder flux and other contaminants to enter the rolled circuit leading to corrosion.

In a preferred embodiment, the rolled inductive device is held together via a polymeric bonding layer, preferably a low dielectric bonding layer used in conjunction with a low dielectric flexible circuit substrate.

Referring now to FIG. 13, a circuit assembly used in forming an inductive device in accordance with the present invention is shown generally at 150. Circuit 150 is comprised of a highly conductive metal bonded to a thin flexible dielectric film or substrate 152. This substrate is preferably a thermoplastic material such as a thin (between about 1 to about 10 mils) dimensionally stabilized glass reinforced fluoropolymer which has a high melting point (between about 260° C. to about 330° C.). Such a fluoropolymer/glass substrate may include polytetrafluoroethylene (PTFE); a copolymer having a tetrafluoroethylene backbone with a fully flourinated alkoxy side chain (manufactured by DuPont under the trademark Teflon PFA, and by Hoechst under the trademark TFA); a copolymer of tetrafluoroethylene and hexafluoropropylene (FEP); or a glass reinforced fluoropolymer/polyimide construction as is described in U.S. Application Ser. No. 755,074, now U.S. Pat. No. 4,634,631 and U.S. Application Ser. No. 755,067, now U.S. Pat. No. 4,647,508, both of which are assigned to the assignee hereof and incorporated herein by reference. The metal is deposited and etched so as to produce a circuit pattern consisting of one or more signal lines 154.

A polymeric bonding layer 160 is then applied, e.g., by lamination or by coating, preferably to the back side of substrate 152 (i.e., the side opposite signal lines 154) as shown in FIG. 12. Alternatively, bonding layer 160 may be applied to the front side of circuit 150 or to both front and back sides of circuit 150. It will be appreciated that when application of bonding layer 160 is to the front side, the bonding layer either must be prevented from covering the input/output pads of the circuit during application; or it will have to be removed from this area after application. Bonding layer 160 should be comprised of a polymeric material, preferably a low dielectric constant (2.0-2.9) thermoplastic material. Alternatively, a low dielectric constant thermosetting material may be used as a bonding layer. Such a thermoset includes fluorinated epoxies such as is described in U.S Pat. Nos. 3,852,222 and 3,872,045; and fluorinated polyimides, an example of which is marketed under the trademark THERMID FA-700 manufactured by National Starch of Bridgewater, N.J. If a thermoplastic bonding layer is utilized, the thermoplastic should be one which has a lower melting or softening point than the softening point of substrate 152. Preferably, bonding layer 168 has a melting point of between about 200° C. to about 310° C. Alternatively, the bonding film could have a softening temperature equivalent to that of the inductive device substrate but with a lower melt viscosity. As a consequence, the bonding layer will flow significantly to seal and bond the inductive device while the substrate will undergo minimal flow. Bonding layer 160 is preferably a fluoropolymer film such as ethylene tetrafluoroethylene (manufactured by DuPont under the trade name TEFZEL); fluorinated ethylene-propylene copolymer (manufactured by 3M under the trade name 6700 bonding film); a copolymer of TFE and a fully fluorinated alkoxy side chain (TFA or PFA) (only if the substrate is polytetrafluoroethylene); or a microglass reinforced version of any of the materials (FEP, Tefzel, TFA, PFA). It will be appreciated that the bonding layer may be comprised of a filled or unfilled polymeric material. Use of a filled material may be beneficial in controlling melt flow or increasing permeability.

The application step of bonding layer 160 to substrate 152 is typically carried out at a temperature above the softening point of the bonding layer, but below the softening point of the substrate, so that the circuit pattern (i.e., signal line 154) remains intact on substrate 152.

The inductive device of the present invention is formed by tightly rolling up flexible circuit 150 of FIG. 12 into a cylindrical or other shape. The rolled circuit of FIG. 12 is then heat sealed using any suitable heat sealing procedure. For example, the rolled circuit may be placed into a tight fitting die (not shown) which is then heated up to melt the bonding layer, thus heat sealing the package. As the package heats up in the tightly-fitting die, the materials expand and provide sufficient pressure to bond the circuit together. Other methods of heat sealing (besides the use of a die) would include any means which holds or retains the rolled circuit so that it does not loosen or unravel during the heating and cooling steps. Such retaining means may include a clip for holding the rolled circuit tightly or a process which maintains tension on the outside end of the circuit. Thereafter, the bonded inductive device may be encapsulated for through hole or surface mounting.

The method of bonding an inductive device and the inductive device formed thereby in accordance with the present invention provides many features and advantages over those bonding methods which use adhesives. For example, the dielectric constant of the substrate and bonding layers may be closely matched resulting in lower signal distortion than is possible with conventional adhesives. Also, the polymeric bonding film tends to fill in air gaps in the rolled circuit thereby achieving more uniform transmission characteristics. In addition, the resulting rolled circuit has excellent resistance to soldering heat (i.e., the circuit will not unroll after exposure to a 260° C. solder bath). Finally, at least another advantage of the present invention is the excellent hermetic sealing provided against water and other contaminants.

While preferred embodiments have been shown and described, various modifications and substitutions many be made thereto without departing from the spirit and scope of the invention. Accordingly, it is to be understood that the present invention has been described by way of illustrations and not limitation.

What is claimed is:

1. An inductive device comprising:
an electrically nonconductive flexible substrate having a first end longitudinally spaced from a second end;
first electrically conducting circuit trace means having an input section at said first end and extending longitudinally a preselected distance along said substrate, said first circuit trace means terminating at a first electrically conducting connecting site;
second electrically conducting circuit trace means, said second circuit trace means having an output section at said first end electrically connected to a second connecting site;
said substrate including extension means extending laterally from at least one location along said substrate, said extension means defining connection tab means, said first connecting site being positioned on said connection tab means; and
said substrate being rolled beginning at said second end to form a plurality of internally rolled layers terminating at an outer rolled layer and wherein during rolling, said connection tab means is folded over so that first and second connecting sites electrically mate at one of said internally rolled layers to interconnect said first and second circuit trace means to define a single, continuous, rolled circuit trace.

2. The device of claim 1 including:
a magnetic core, said substrate being rolled about said magnetic core.

3. The device of claim 1 wherein said substrate includes:
second lateral extension means, said input section being positioned on said second lateral extesnion means; and
third lateral extension means, said output section being positioned on said third lateral extension means.

4. The device of claim 1 including:
third electrically conducting circuit trace means on said substrate and spaced from said first and second circuit trace means, said third circuit trace means having a start pad, extending preselected distance along said substrate and terminating at an end pad, said end pad being positioned on said connection tab means; and whereby during rolling, said first connecting site of said first circuit trace means electrically mates with said start pad of said third trace means, and said end pad of said third trace means electrically mates with said second connecting site of said second trace means wherein said interconnected first, second and third trace means define a single, continuous, rolled circuit trace.

5. The device of claim 1 including:
a plurality of discrete electrically conducting circuit trace means on said substrate and spaced from said first and second circuit trace means, said plurality of discrete circuit trace means each having a start pad, extending a preselected distance along said substrate, and terminating at an end pad, said end pads being positioned on said connection tab means; and whereby during rolling, said first connecting site of said first circuit trace means electrically mates with a start pad from one of said discrete circuit trace means and said second connecting site of said second circuit trace means electrically mates with an end pad from another of said discrete circuit trace means and whereby the remaining unmated start pads and end pad respectively mate with one another wherein said interconnected first, second and plurality of discrete circuit trace means define a single, continuous, rolled circuit trace.

6. The device of claim 4 including:
a magnetic core, said substrate being rolled about said magnetic core.

7. The device of claim 5 including: a magnetic core, said substrate being rolled about said magnetic core.

8. The inductive device of claim 1 wherein said first and second mated circuit trace means define a primary rolled circuit trace and including:
third electrically conducting circuit trace means having an input section and extending longitudinally a preselected distance along said substrate, said third circuit trace means terminating at a third connecting site, said third connecting site being positioned on said connection tab means;
fourth electrically conducting circuit trace means, said fourth circuit trace means having an output section electrically connected to a fourth connecting site;
whereby, during rolling, said third and fourth connecting sites electrically mate to interconnect said third and fourth circuit trace means wherein said interconnected third and fourth trace means define a secondary continuous, rolled circuit trace.

9. The device of claim 8 wherein:
said primary and secondary rolled circuit traces are mutually parallel to form a transformer.

10. The device of claim 8 including:
a magnetic core, said substrate being rolled about said magnetic core.

11. The device of claim 8 wherein said substrate includes:
second lateral extension means, said input section being positioned on said second lateral extension means; and
third lateral extension means, said output section being positioned on said third lateral extension means.

12. The device of claim 8 including:
fifth electrically conducting circuit trace means on said substrate and spaced from said first, second, third and fourth circuit trace means, said fifth circuit trace means having a start pad, extending a preselected distance along said substrate, and terminating at an end pad, said end pad being positioned on said connection tab means; and whereby during rolling, said third connecting site of said third trace means electrically mates with said start pad of said fifth trace means, and said end pad of said fifth trace means electrically mates with said fourth connecting site of said fourth trace means wherein said interconnected third, fourth and fifth trace means define a continuous, rolled circuit trace.

13. The device of claim 8 including:
a plurality of discrete electrically conducting circuit trace means, said plurality of discrete circuit trace means each having a start pad, extending a preselected distance along said substrate, and terminating at an end pad, aid end pads being positioned on said connection tab means; and whereby during rolling, said third connecting site of said third circuit trace means electrically mates with a start pad from one of said discrete circuit trace means and said fourth connecting site of said fourth circuit trace means electrically mates with an end pad from another of said discrete circuit trace means and whereby the remaining unmated start pads and end pad respectively mate with one another wherein said interconnected third, fourth and plurality of discrete circuit trace means define a continuous rolled circuit trace.

14. The device of claim 12 including:
a magnetic core, said substrate being rolled about said magnetic core.

15. The device of claim 13 including:
a magnetic core, said substrate being rolled about said magnetic core.

16. The device of claim 8 including:
fifth electrically conductive circuit trace means extending from said third circuit trace means and termianting at a fifth connecting site, said fifth connecting site being positioned on said connection tab means;
sixth electrically conductive circuit trace means, said sixth circuit trace means having an output section, extending longitudinally a preselected distance along said substrate and terminating at a sixth connecting site; and
whereby, during rolling, said fifth and sixth connecting sites electrically mate to interconnect said fifth and sixth circuit trace means.

17. The device of claim 16 including:
a magnetic core, said substrate being rolled about said magnetic core.

18. The device of claim 1 including:
extension means comprising dielectric substrate material having conductive material thereon extending from said first end;
whereby during rolling, said extension means comprises at least said outer rolled layer to thereby shield said internally rolled layers.

19. The device of claim 1 including;
extension means comprising dielectric substrate material having conductive material thereon extending from said first end;

whereby during rolling, said extension means comprises at least said outer rolled layer to thereby shiled said internally rolled layers.

20. The device of claim 1 including;
extension means comprising dielectric substrate material having conductive material thereon extending from said first end;
whereby during rolling, said extension means comprises at least said outer rolled layer to thereby shield said internally rolled layers.

21. The device of claim 1 including;
extension means comprising dielectric substrate material having conductive material thereon extending from said first end;
whereby during rolling, said extension means comprises at least said outer rolled layer to thereby shield said interally rolled layers.

22. The device of claim 1 including;
extension means comprising dielectric substrate material having conductive material thereon extending from said first end;
whereby during rolling, said extension means comprises at least said outer rolled layer to thereby shield said internally rolled layers.

23. The device of claim 1 including:
adhesive material on said substrate to bond said rolled substrate together.

24. The device of claim 1 wherein said flexible substrate is comprised of a polymeric material and includes opposed planar surfaces and including:
a bonding layer disposed on at least one of said opposed planar surfaces, said bonding layer comprising a polymeric material having a softening temperature which is less than or equal to the softening temperature of said polymeric substrate; and
said bonding layer being heated above its softening temperature whereby said rolled flexible substrate is bonded together.

25. The device of claim 25 wherein:
said polymeric substrate is comprised of a thermoplastic material.

26. The device of claim 25 wherein:
said thermoplastic substrate comprises a glass reinforced fluoropolymer.

27. The device of claim 26 wherein:
said fluoropolymer is selected from the group consisting of polytetrafluoroethylene, a copolymer having a tetrafluoroethylene backbone with a fully fluorinated alkoxy side chain and a copolymer of tetrafluoroethylene and hexafluoropropylene.

28. The device of claim 25 wherein:
said thermoplastic substrate has a melting temperature of between about 270° C. to about 330° C.

29. The device of claim 24 wherein:
said polymeric bonding layer is comprised of a thermoplastic material.

30. The device of claim 29 wherein:
said thermoplastic bonding layer comprises a fluoropolymer.

31. The device of claim 30 wherein:
said fluoropolymer is selected from the group/consisting of ethylene tetrafluoroethylene, fluorinated ethylene-propylene copolymer and a copolymer having a tetrafluoroethylene backbone with a fully fluorinated alkoxy side chain.

32. The device of claim 29 wherein:
said bonding layer has a softening temperature of between about 220° C. to about 320° C.

33. The device of claim 24 wherein:
said polymeric bonding layer is a thermosetting material.

34. The device of claim 24 wherein:
said substrate is comprised of a material having a high permeability; and
said bonding layer is comprised of a material having high permeability.

35. The device of claim 30 wherein:
said fluoropolymer includes microglass reinforcement.

36. The inductive device of claim 1 wherein said first and second circuit trace means define a primary rolled cirucit trace and including:
third electrically conducting circuit trace means having an input section and extending longitudinally a preselected distance along said substrate, said third circuit trace means terminating at a third connection site, said third connecting site being positioned on said connection tab means;
fourth electrically conducting circuit trace means, said fourth circuit trace means having an output section electrically connected to a fourth connecting site;
fifth electrically conducting circuit trace means having an input section and extending longitudinally a preselected distance along said substrate, said fifth circuit trace means terminating at a fifth connection site, said fifth connection site being positioned on said connection tab means;
sixth electrically conducting circuit trace means extending longitudinally a preselected distance along said substrate, said sixth trace means having opposed ends which terminate respectively at sixth and seventh connecting sites, said sixth and seventh connecting sites being positioned on said connection tab means;
seventh electrically conducting circuit trace means, said seventh circuit trace means having an output section electrically connected to an eighth connecting site;
wherein during rolling, said third and fourth connecting sites electrically mate to interconnect said third and fourth circuit trace means wherein said interconnected third and fourth trace means define a secondary continuous, rolled circuit trace; and
wherein, during rolling, said fifth and sixth connecting sites electrically mate and said seventh and eighth connecting sites electrically mate to interconnect said fifth, sixth and seventh circuit trace means wherein said interconnected fifth, sixth and seventh trace means define a tertiary continuous, rolled cirucit trace.

37. The device of claim 36 wherein:
said primary, secondary and tertiary rolled circuit traces are mutually parallel to form a transformer.

38. The device of claim 12 wherein:
said primary and secondary rolled circuit traces are mutually parallel to form a transformer.

39. The device of claim 13 wherein:
said primary and secondary rolled circuit traces are mutually parallel to form a transformer.

40. The device of claim 16 wherein:
said primary and secondary rolled circuit traces are mutually parallel to form a transformer.

* * * * *